United States Patent
Deng et al.

(10) Patent No.: US 7,894,173 B2
(45) Date of Patent: Feb. 22, 2011

(54) ENHANCING BANDWIDTH OF ESD NETWORK USING TRANSFORMERS

(75) Inventors: Kuo-Liang Deng, Hsin-Chu (TW); Tsung-Yang Hung, Jhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 170 days.

(21) Appl. No.: 12/211,576

(22) Filed: Sep. 16, 2008

(65) Prior Publication Data

US 2010/0067154 A1 Mar. 18, 2010

(51) Int. Cl.
*H02H 3/22* (2006.01)
(52) U.S. Cl. .......................................... 361/56; 361/111
(58) Field of Classification Search ................... 361/35, 361/56, 118, 111
See application file for complete search history.

(56) References Cited

U.S. PATENT DOCUMENTS

| | | | | |
|---|---|---|---|---|
| 7,283,345 | B2 * | 10/2007 | Liu | 361/118 |
| 7,333,603 | B1 * | 2/2008 | Sallaway et al. | 379/391 |
| 7,616,414 | B2 * | 11/2009 | Marholev | 361/56 |
| 2007/0290713 | A1 * | 12/2007 | Ding et al. | 326/30 |
| 2008/0267301 | A1 * | 10/2008 | Alfano et al. | 375/258 |

OTHER PUBLICATIONS

Kossel, M., et al., "A T-Coil-Enhanced 8.5Gb/s High-Swing Source-Series-Terminated Transmitter in 65nm Bulk CMOS," pp. 110, 111 and 599, IEEE International Solid-State Circuits Conference, Feb. 4, 2008.
Meghelli, M., et a, "A 10Gb/s 5-Tap-DFE/4-Tap-FFE Transceiver in 90nm CMOS," 2006, 10 pgs., IEEE International Solid-State Circuits Conference, Feb. 6, 2006.
Pillai, E., et al., "Novel T-Coil Structure and Implementation in a 6.4-Gb/s CMOS Receiver to Meet Return Loss Specifications,"2007, pp. 147-153, Electronic Components and Technology Conference, Jun. 25, 2007.
Galal, S., et al., "40Gb/s Amplifier and ESD Protection Circuit in 0.18-μm CMOS Technology," Dec. 2004, pp. 2389-2396, IEEE Journal of Solid-State Circuits, vol. 39, No. 12.
Deng, K.-L., et al., "Design and Analysis of Novel High-Gain and Broad-Band GaAs pHEMT MMIC Distributed Amplifiers With Traveling-Wave Gain Stages," Nov. 2003, pp. 2188-2196, IEEE Transactions on Microwave Theory and Techniques, vol. 51, No. 11.

* cited by examiner

*Primary Examiner*—Danny Nguyen
(74) *Attorney, Agent, or Firm*—Slater & Matsil, L.L.P.

(57) ABSTRACT

An integrated circuit device includes a first pad and a second pad; electrostatic discharging (ESD) devices coupling the first pad and the second pad to a discharging path; a transformer including a first end, a second end, a third end and a fourth end, wherein the first end and the second end are coupled to the first pad and the second pad, respectively; and a transceiver circuit coupled to the first end and the second end of the transformer.

20 Claims, 7 Drawing Sheets

ENHANCING BANDWIDTH OF ESD NETWORK USING TRANSFORMERS

TECHNICAL FIELD

This invention relates generally to integrated circuits, and more particularly to electrostatic discharging (ESD) circuits for protecting signal transmission networks, and even more particularly to improving the bandwidth of the ESD circuits.

BACKGROUND

In broadband networks, signals are transmitted between components in the networks, such as computer networks, communication networks, and the like. The components in a network may have exposed interfaces that subject the network to electrostatic discharging (ESD) currents, which are caused by the discharging of electrostatic charges. The ESD currents may reach very high levels in a very short period of time, and hence have the potential to destroy the components in the network. Accordingly, ESD protection circuits are designed to protect the components in the network from the ESD currents.

Figure 1:
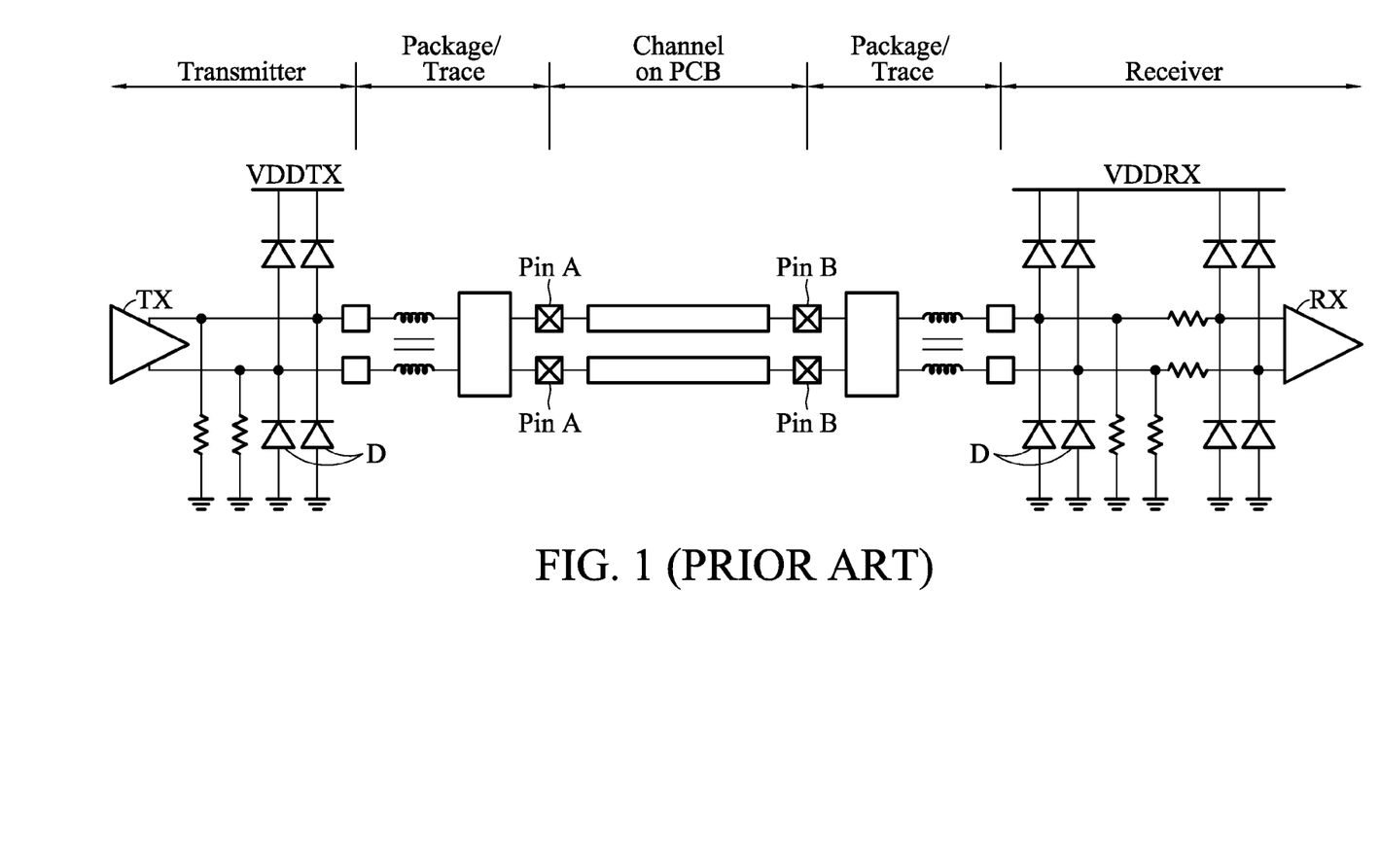
FIG. 1 illustrates a conventional broadband data network formed on a printed circuit board.

FIG. 1 illustrates a conventional network formed on a printed circuit board (PCB). A transmitter, which is a semiconductor chip comprising integrated circuits, sends data to a receiver, which may be another semiconductor chip comprising integrated circuits. The data are transmitted through a channel on the PCB. To protect the transmitter and the receiver, diodes D are formed in the semiconductor chips as ESD devices. If an ESD transient occurs, for example, on pins A or pins B of the semiconductor chips, diodes D may be activated to conduct the ESD currents, and hence terminating circuit TX and receiving circuit RX are protected.

The circuit shown in FIG. 1 suffers from drawbacks. Since the package traces, the channels on a PCB and diodes D have parasitic capacitances. These parasitic capacitances form low-pass filters that limit the bandwidth of the network, particularly at high frequencies. Therefore, the frequency of the network as shown in FIG. 1 is limited to about 5 GHz to about 6 GHz. However, modern data networks often require frequencies up to 10 GHz or even higher. The conventional network can thus no longer meet the bandwidth requirement of the modern data networks.

Figure 2:
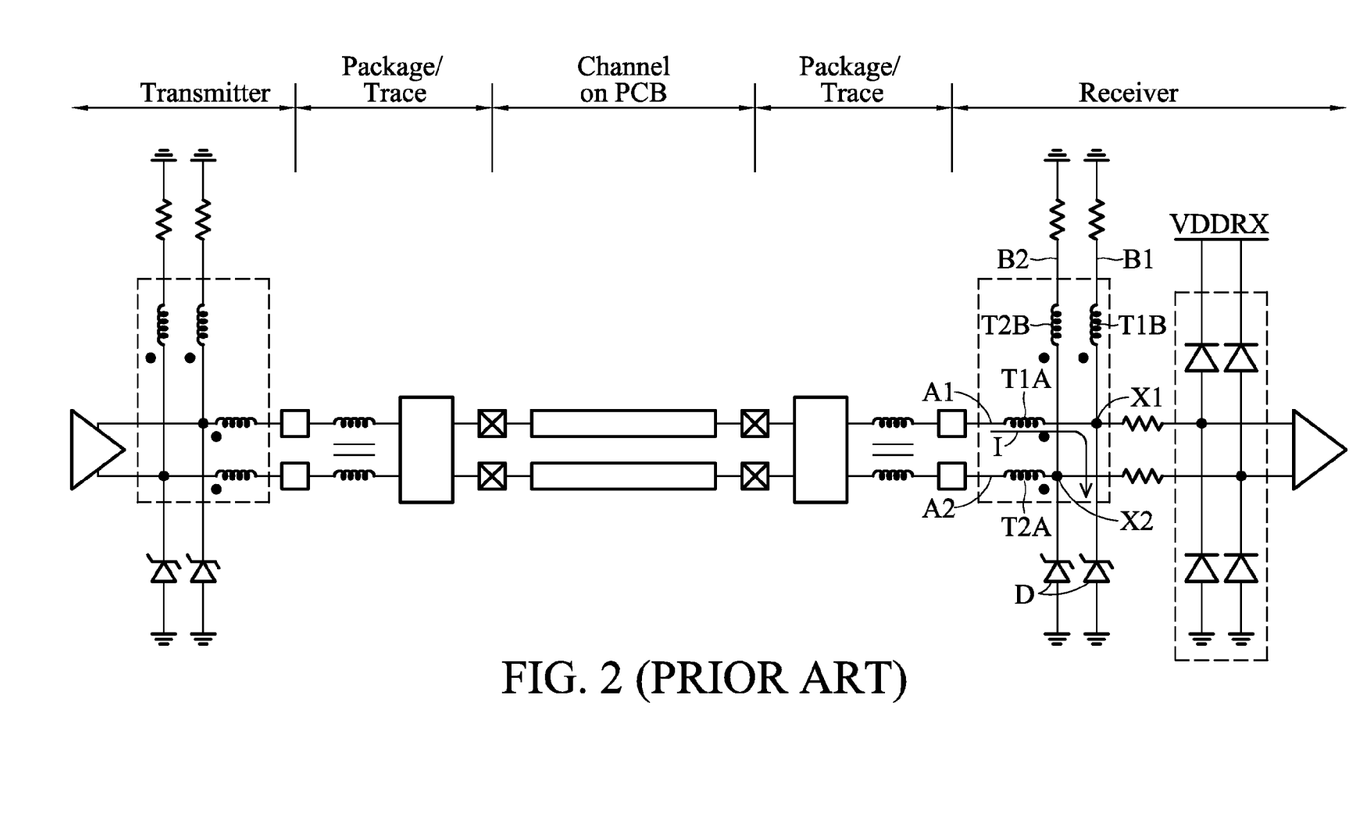
FIG. 2 illustrates another conventional broadband data network incorporating T-coils.
Figure 3:
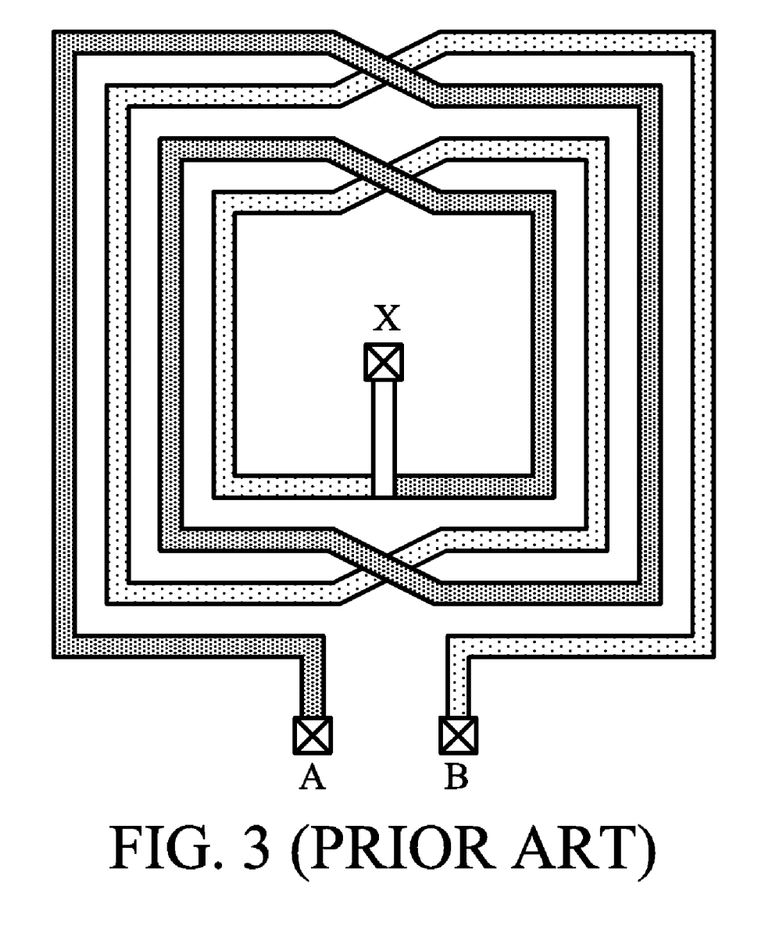
FIG. 3 illustrates a T-coil.

To solve the above-discussed bandwidth limiting problems, a solution as shown in FIG. 2 was proposed. In this solution, two T-coils are used in the network to provide inductance for compensating for the input impedance. FIG. 3 illustrates a T-coil, which is formed of coiled metal lines. The T-coil has terminals A, B, and X (hence the name T-coil), wherein terminal X is a central tap. Referring back to FIG. 2, inductors T1A and T1B belong to a first T-coil, wherein points A1, B1 and X1 are the terminals of the first T-coil. Inductors T2A and T2B belong to a second T-coil, wherein points A2, B2 and X2 are the terminals of the second T-coil. The inductances of inductors T1A, T1B, T2A, and T2B compensate for the parasitic capacitance caused by the package/trace, the bond pads and ESD diodes D, and hence the bandwidth of the network is improved.

The network shown in FIG. 2, however, also suffers from drawbacks. Current I shown in FIG. 2 illustrates a possible ESD current path. Since ESD currents need to flow through inductors T1A and T2A (which are portions of the T-coils), the T-coils need to be thick and wide enough so that the inductors with minimized resistances are not damaged by the ESD currents, which may be very high. As a result, the T-coils need to be formed in multiple metal layers or have great metal widths to satisfy the demanding resistance requirement. This requires the T-coils to occupy more chip area or to use lower metal layers. However, larger T-coils result in greater parasitic capacitances to be introduced, and hence the improvement to the bandwidth is limited. Accordingly, a new ESD circuit with improved bandwidth and reduced chip area usage is needed.

SUMMARY OF THE INVENTION

In accordance with one aspect of the present invention, an integrated circuit device includes a first pad and a second pad; electrostatic discharging (ESD) devices coupling the first pad and the second pad to discharging paths; a transformer including a first end, a second end, a third end and a four end, wherein the first end and the second end are coupled to the first pad and the second pad, respectively; and a transceiver circuit coupled to the first end and the second end of the transformer.

In accordance with another aspect of the present invention, an integrated circuit device includes a semiconductor chip, which further includes a first bond pad and a second bond pad; and a transformer. The transformer includes a first coiled metal line including a first end and a second end; and a second coiled metal line including a third end and a fourth end, wherein the first end and the third end are connected to the first bond pad and the second bond pad, respectively. The semiconductor chip further includes a first ESD path coupled between the first bond pad and a power or a ground (power/ground); a second ESD path coupled between the second bond pad and the power/ground; and a circuit including a first terminal coupled to the first bond pad; and a second terminal coupled to the second bond pad.

In accordance with yet another aspect of the present invention, an integrated circuit device includes a first semiconductor chip, a second semiconductor chip, and a mounting board, where the first semiconductor chip and the second semiconductor chip are mounted on, and interconnected through, the mounting board. The first semiconductor chip includes a first pair of bond pads; a first transformer connected to the first pair of bond pads; a first pair of ESD devices coupling the first pair of bond pads to a power/ground; and a receiving circuit coupled to the first pair of bond pads. The second semiconductor chip includes a second pair of bond pads; a second transformer connected to the second pair of bond pads; a second pair of ESD devices coupling the second pair of bond pads to the power/ground; and a transmitting circuit coupled to the second pair of bond pads.

The advantageous features of the present invention include increased bandwidth, and reduced chip area usage.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Figure 4:
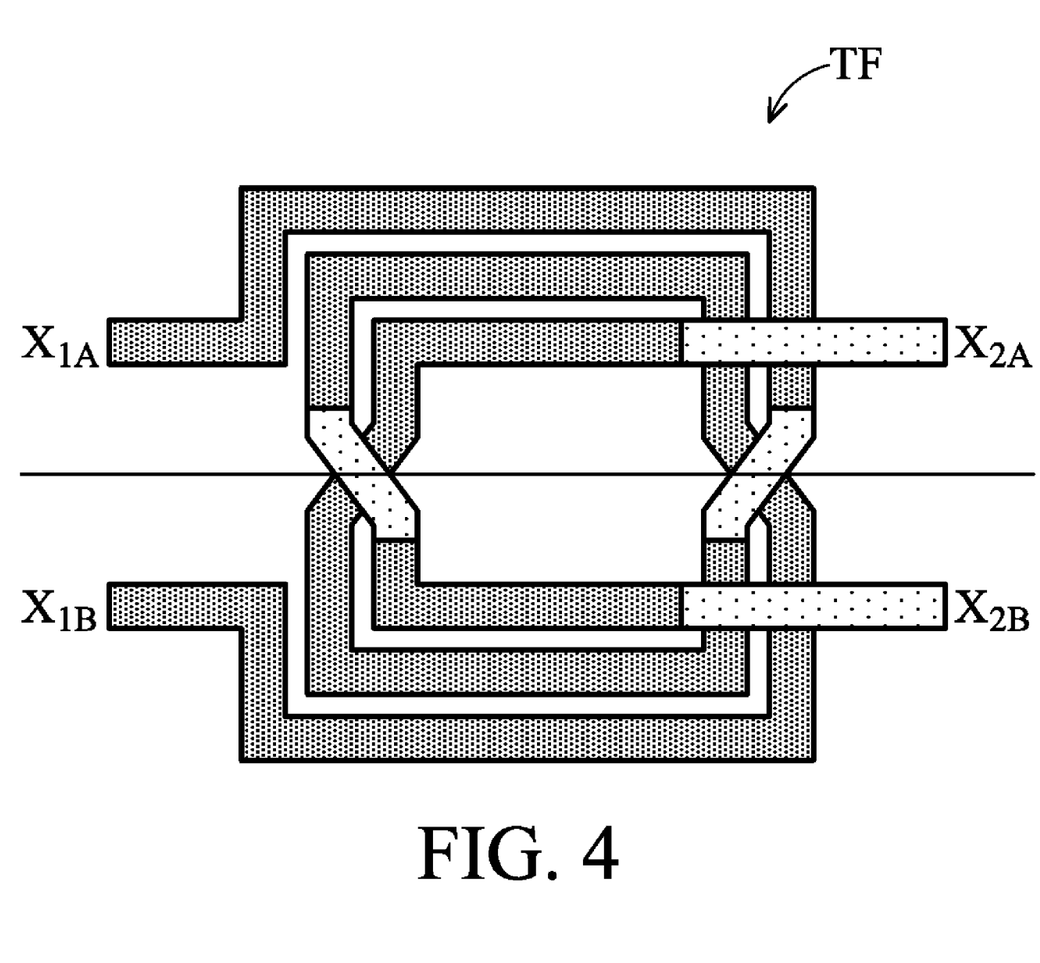
FIG. 4 illustrates a transformer.

FIG. 4 illustrates transformer TF used in the embodiments of the present invention. Transformer TF may be built inside a semiconductor chip (die), and is formed of coiled metal lines. The coiled metal lines may extend into two, three, or even more metallization layers. However, since transformer TF does not need to conduct ESD currents, it may be thin, and may be formed in lower metallization layers (of the residing semiconductor dies) other than the top two metallization layers (layers Mtop and Mtop-1). For example, transformer TF may be formed in any of the bottom metallization layer (M1) to layer Mtop-2, although it may also be formed in the top two metallization layers.

Transformer TF has four terminals, namely X1A, X1B, X2A, and X2B. Terminals X1A and X2A are interconnected through metal lines and vias. Terminals X1B and X2B are interconnected through metal lines and vias. Accordingly, transformer TF is equivalent to two inductors, with one connected between terminals X1A and X2A, and the other connected between terminals X1B and X2B.

Figure 5:
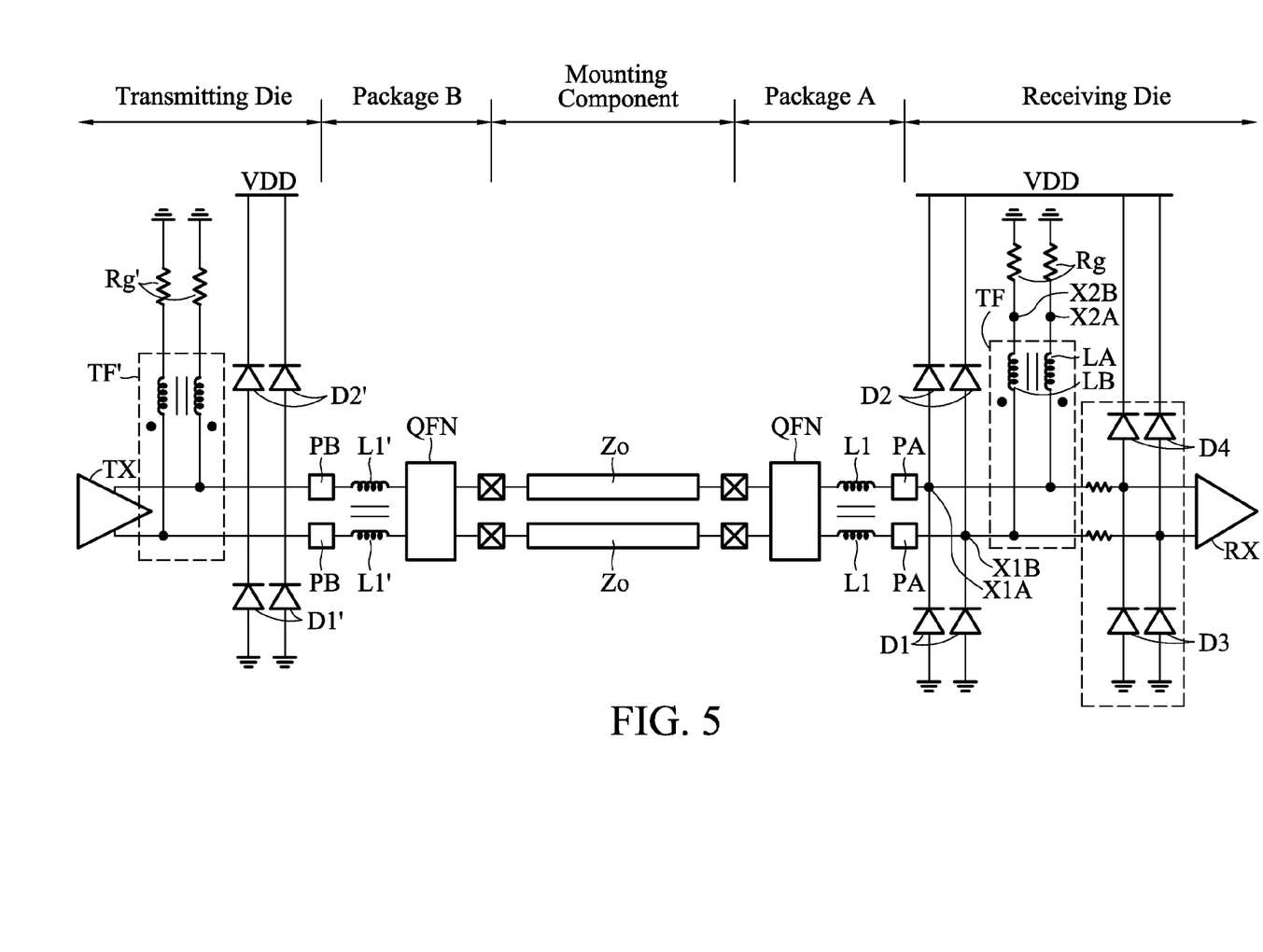
FIG. 5 illustrates an embodiment of the present invention including transformers.

FIG. 5 illustrates a data network incorporating the transformer TF as shown in FIG. 4. Transmitting component, which may be a semiconductor die (and hence referred to as transmitting die or transmitting chip hereinafter) comprising integrated circuits, transmits data. Receiving component, which may be another semiconductor die comprising integrated circuits (and hence referred to as receiving die or receiving chip hereinafter), receives the data transmitted by the transmitting die. The data are transmitted through a channel, which may be inside (or on) a printed circuit board (PCB), or any other channel including transmission lines. Components Z0 represent the channel on the PCB boards. The transmitting die and the receiving die are packaged in packages A and B, respectively. The components marked as QFN represent the packages of the transmitting and receiving dies, which may be quad flat no-lead (QFN) packages or other package types.

Pads PA and Pads PB are the bond pads of the receiving die and the transmitting die, respectively. Each of pads PA is on one of the signal paths coupled to receiving circuit RX, wherein the signal paths may form a differential pair. Each of pads PB is on one of the signal paths coupled to transmitting circuit TX, wherein the signal paths may form a differential pair. ESD devices, such as ESD diodes D1, are formed in the receiving die, wherein ESD diodes D1 are coupled between pads PA and a discharging path. In the embodiment shown in FIG. 5, the discharging path is connected to the electrical power or ground (referred to as power/ground hereinafter). ESD diodes D2 are formed between power line VDD and pads PA to conduct the ESD transient that may occur between power line VDD and pads PA. ESD diodes D1 protect pads PA and conduct the ESD transient to VSS.

Optionally, a second ESD protection circuit is formed between the first ESD devices D1 and receiving circuit RX. In an exemplary embodiment, the second ESD protection circuit includes ESD diodes D3 and ESD diodes D4.

Transformer TF is connected to the above-discussed ESD protection circuit. Transformer TF has two functions. First, it is used to match the impedance at bond pads PA to the input impedance of the receiving circuit RX. Second, it provides inductance for compensating for the parasitic capacitance of ESD diodes D1, D2 and D3, and package A, so that the bandwidth of the receiving component, including package A and the receiving die, can be improved. Terminals X1A and X1B of transformer TF are connected to pads PA, and terminals X2A and X2B are connected to terminating resistors Rg, which may be further connected to the power/ground. In an exemplary embodiment, terminating resistors Rg have resistances of about 50 ohms. The equivalent inductors of transformer TF are shown as inductors LA and LB, wherein the equivalent inductor LA is the inductor between terminals X1A and X2A (also refer to FIG. 4), and the equivalent inductor LB is the inductor between terminals X1B and X2B (also refer to FIG. 4). In an exemplary embodiment, the inductances of inductors LA and LB are about 0.8 nH to about 1.5 nH. However, the actual preferable inductance depends on the parasitic capacitances and package types that the inductors LA and LB need to compensate for.

Figure 6:
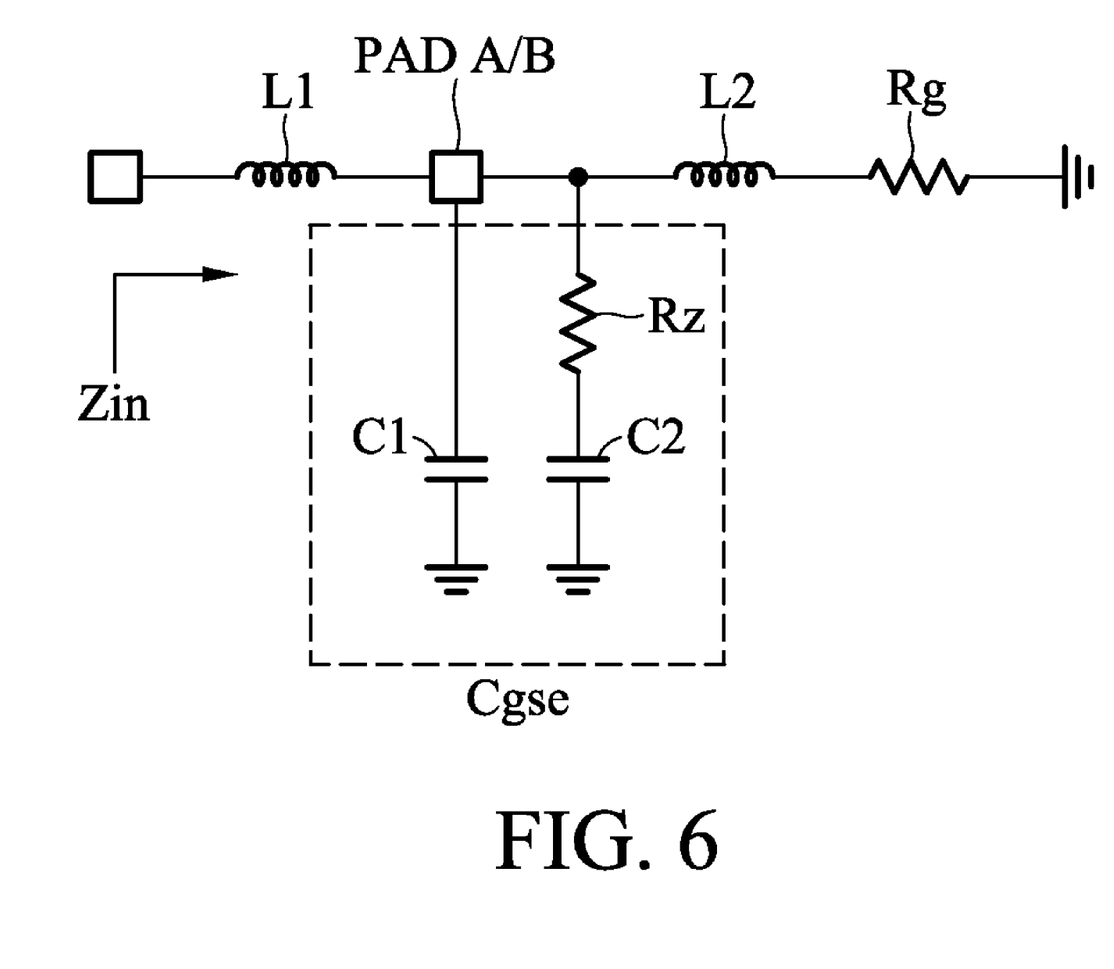
FIG. 6 is an equivalent circuit of one of differential signal paths at the front end of a transceiver circuit.

FIG. 6 illustrates an equivalent circuit diagram of the portion of the circuit marked as circuit CR in FIG. 5, wherein the equivalent circuit diagram only shows one of the differential signal paths. Inductor L1 represents the inductance of bond wire/trace of package A, in which the receiving die is packaged. Capacitor C1 represents the capacitance of the bond pads PA, and diodes D1 and D2. Capacitor C2 represents the capacitance of diodes D3 and the equivalent capacitance of the receiving circuit RX observed at the input terminals (interfaces) of circuit RX. Resistance Rz represents the resistances of ESD diodes D3 and ESD resistors Rs. Capacitor Cgse is the equivalent capacitance including all the capacitors of C1 and C2. Inductor L2 represents the inductance of inductor LA or LB.

The cutoff frequency ωc of the above illustrated circuit diagram may be expressed as:

$$\omega c = 1/\sqrt{Cgse * L1} \qquad [\text{Eq. 1}]$$

Figure 7:
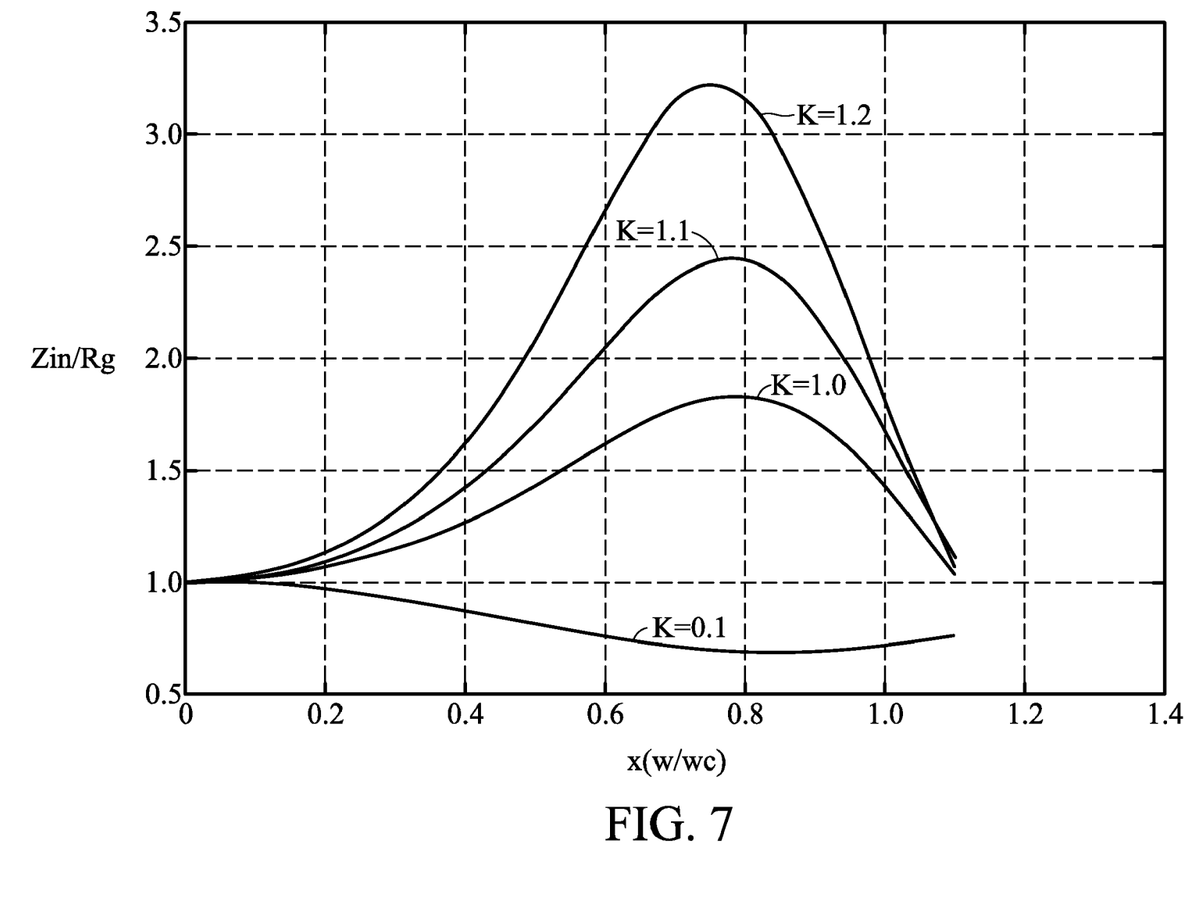
FIG. 7 illustrates the frequency response of the embodiment of the present invention.

Using the equivalent circuit diagram as shown in FIG. 6 and equation 1, FIG. 7 is generated to illustrate normalized input impedance Zin/Rg as a function of normalized frequency (ω/ωc), wherein the input impedance Zin is the impedance measured at the terminals PA in FIG. 5. FIG. 7 illustrates that the frequency response of circuit CR is affected by k values, wherein the k value is equal to sqrt(L2/L1). FIG. 7 reveals that by adjusting the values of k, the frequency response may be changed to desirable patterns. Since the package inductance L1 is mainly affected by the packaging structure, it is relatively stable. The k values may thus be adjusted easily by adjusting inductance L2, which is the inductance of transformer TF. Therefore, the embodiment shown in FIG. 5 may be easily designed to achieve the desirable frequency response.

The transformer TF as discussed in the preceding paragraphs may also be formed in the transmitting die. Referring back to FIG. 5, transformer TF' is formed between terminating resistors Rg' and bond pads PB of the transmitting die, wherein the transformer TF' may have essentially the same structure as shown in FIG. 4. Similar to the receiving side, the transformer TF' is used not only for impedance matching purpose, but also for compensating for the parasitic capacitance of ESD diodes D1', D2' and package B, so that the bandwidth on the transmitting side is also improved. ESD diodes D1' and D2' are connected to bond pads PB for conducting any ESD currents that may occur on pads PB. Therefore, transformers may be formed on both the front ends (the receiving end of the receiver and the transmitting end of the transmitter) of transceivers (transmitters and receivers).

It is appreciated that although in the embodiments discussed in the preceding paragraphs, transformers are formed at the front ends of transceivers in broadband networks, they may also be used in other dies. Accordingly, the circuit RX as shown in FIG. 5 may be any other type of circuit.

The embodiments of the present invention have several advantageous features. First, the transformers provide additional inductance for compensating for the parasitic capacitance in the front end of the transceivers, and hence the bandwidths of the ESD protection circuits formed at the front ends of the transceivers are improved. Second, referring to FIG. 5, if an ESD transient occurs at pads PA, the respective ESD current may flow directly to the ground through ESD diodes D1 without flowing through transformer TF. Therefore, transformer TF may be formed of thin metal lines or narrow traces, and hence may use less chip area. Third, compared to conventional ESD circuits using two T-coils, the embodiments of the present invention only require one transformer for each pair of differential signal paths. Therefore, the required chip area for the transformer is at most one-half of the required chip area for two T-coils. Further, in the transmitting die or the receiving die, the transformer may be formed directly underlying pads PA or PB to further reduce the usage of chip area.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. An integrated circuit device comprising:
a first pad and a second pad;
electrostatic discharging (ESD) devices coupling the first pad and the second pad to a discharging path;
a transformer comprising a first end, a second end, a third end and a fourth end, wherein the first end and the second end are coupled to the first pad and the second pad, respectively, and wherein the first end and the second end are connected to the third end and the fourth end, respectively, through coiled metal connections; and
a transceiver circuit coupled to the first end and the second end of the transformer.

2. An integrated circuit comprising:
a first pad and a second pad;
electrostatic discharging (ESD) devices coupling the first pad and the second pad to a discharging path;
a transformer comprising a first end, a second end, a third end and a fourth end, wherein the first end and the second end are coupled to the first pad and the second pad, respectively;
a transceiver circuit coupled to the first end and the second end of the transformer; and
additional ESD devices coupled between the transformer and the transceiver circuit, wherein the additional ESD devices couple inputs of the transceiver circuit to the discharging path.

3. The integrated circuit device of claim 2, wherein the first terminating resistor and the second terminating resistor are connected to a ground.

4. The integrated circuit device of claim 2, wherein the ESD devices, the transformer, and the transceiver circuit are in a first semiconductor chip, and wherein the first pad and the second pad are bond pads of the first semiconductor chip.

5. The integrated circuit device of claim 4, wherein the first end and the second end of the transformer are directly connected to the first pad and the second pad, respectively.

6. The integrated circuit device of claim 2 further comprising:
a second semiconductor chip comprising:
a third pad and a fourth pad;
additional electrostatic discharging (ESD) devices coupled to the third pad and the fourth pad;
an additional transformer coupled to the third pad and the fourth pad; and
an additional transceiver circuit coupled to the additional transformer, wherein the transceiver circuit is a receiving circuit, and the additional transceiver circuit is a transmitting circuit; and
a transmission channel coupling the first pad and the second pad to the third pad and the fourth pad.

7. The integrated circuit device of claim 2, wherein the transceiver circuit is a receiving circuit.

8. The integrated circuit device of claim 2, wherein the transceiver circuit is a transmitting circuit.

9. The integrated circuit device of claim 1 further comprising:
a first terminating resistor; and
a second terminating resistor, wherein the third end and the fourth end of the transformer are coupled to the first terminating resistor and the second terminating resistor, respectively.

10. The integrated circuit device of claim 2, wherein the transformer comprises a first coiled metal line and a second coiled metal line, and wherein the first coiled metal line comprises the first end, and the second coiled metal line comprises the second end.

11. An integrated circuit device comprising:
a semiconductor chip comprising:
a first bond pad and a second bond pad;
a transformer comprising:
a first coiled metal line comprising a first end and a second end; and
a second coiled metal line comprising a third end and a fourth end, wherein the first end and the third end are connected to the first bond pad and the second bond pad, respectively;
a first electrostatic discharging (ESD) device coupled between the first bond pad and a discharging path selected from a power and a ground;
a second ESD device coupled between the second bond pad and the discharging path; and
a circuit comprising:
a first terminal coupled to the first bond pad; and
a second terminal coupled to the second bond pad.

12. The integrated circuit device of claim 11, wherein the first ESD device and the second ESD device are directly connected to the first bond pad and the second bond pad, respectively.

13. The integrated circuit device of claim 11 further comprising:
a third ESD device coupled between the first bond pad and a power line; and a fourth ESD device coupled between the second bond pad and the power line.

14. The integrated circuit device of claim 11, wherein the circuit is a transceiver circuit selected from the group consisting essentially of a transmitting circuit and a receiving circuit.

15. The integrated circuit device of claim 11 further comprising:
a first terminating resistor having a first end connected to the second end of the transformer, and a second end connected to the discharging path; and
a second terminating resistor having a first end connected to the fourth end of the transformer, and a second end connected to the ground.

16. An integrated circuit device comprising:
a first semiconductor chip comprising:
 a first pair of bond pads;
 a first transformer connected to the first pair of bond pads;
 a first pair of electrostatic discharging (ESD) devices coupling the first pair of bond pads to a ground;
 a receiving circuit coupled to the first pair of bond pads;
 a first terminating resistor connected to the ground; and
 a second terminating resistor connected to the ground, wherein the first transformer comprises a first pair of ends directly connected to the first pair of bond pads, and a second pair of ends connected to the first terminator resistor and the second terminating resistor;
a second semiconductor chip comprising:
 a second pair of bond pads;
 a second transformer connected to the second pair of bond pads;
 a second pair of ESD devices coupling the second pair of bond pads to the ground; and
 a transmitting circuit coupled to the second pair of bond pads; and
a mounting board, where the first semiconductor chip and the second semiconductor chip are mounted on, and interconnected through, the mounting board.

17. The integrated circuit device of claim 16, wherein the second semiconductor chip further comprises:
a first terminating resistor connected to the ground; and
a second terminating resistor connected to the ground, wherein the second transformer comprises a third pair of ends directly connected to the second pair of bond pads, and a fourth pair of ends connected to the first terminating resistor and the second terminating resistor.

18. The integrated circuit device of claim 16, wherein the first transformer has only two ends connected between the first pair of bond pads and the receiving circuit, and wherein the second transformer has only two ends connected between the second pair of bond pads and the transmitting circuit.

19. The integrated circuit device of claim 1, wherein the first end and the third end are directly connected through metal lines, and the second end and the fourth end are directly connected through metal lines.

20. The integrated circuit device of claim 1, wherein the third end and the fourth end are not electrically coupled.

* * * * *

UNITED STATES PATENT AND TRADEMARK OFFICE
CERTIFICATE OF CORRECTION

PATENT NO. : 7,894,173 B2  Page 1 of 1
APPLICATION NO. : 12/211576
DATED : February 22, 2011
INVENTOR(S) : Deng et al.

It is certified that error appears in the above-identified patent and that said Letters Patent is hereby corrected as shown below:

In the Claims
In Col. 5, line 54, claim 2, delete "2." and insert --4.--.
In Col. 6, line 1, claim 3, delete "3." and insert --6.--, delete "claim 2" and insert --claim 4--.
In Col. 6, line 4, claim 4, delete "4." and insert --7.--, delete "claim 2" and insert --claim 4--.
In Col. 6, line 8, claim 5, delete "5." and insert --8.--, delete "claim 4" and insert --claim 7--.
In Col. 6, line 11, claim 6, delete "6." and insert --9.--, delete "claim 2" and insert --claim 4--.
In Col. 6, line 25, claim 7, delete "7." and insert --10.--, delete "claim 2" and insert --claim 4--.
In Col. 6, line 27, claim 8, delete "8." and insert --11.--, delete "claim 2" and insert --claim 4--.
In Col. 6, line 29, claim 9, delete "9." and insert --5.--, delete "claim 1" and insert --claim 4--.
In Col. 6, line 36, claim 10, delete "10." and insert --12.--, delete "claim 2" and insert --claim 4--.
In Col. 6, line 41, claim 11, delete "11." and insert --13.--.
In Col. 6, line 60, claim 12, delete "12." and insert --14.--, delete "claim 11" and insert --claim 13--.
In Col. 6, line 64, claim 13, delete "13." and insert --15.--, delete "claim 11" and insert --claim 13--.
In Col. 7, line 3, claim 14, delete "14." and insert --16.--, delete "claim 11" and insert --claim 13--.
In Col. 7, line 6, claim 15, delete "15." and insert --17.--, delete "claim 11" and insert --claim 13--.
In Col. 7, line 14, claim 16, delete "16." and insert --18.--.
In Col. 7, line 25 & 26, claim 16, delete "termi-nator" and insert --terminating--.
In Col. 8, line 8, claim 17, delete "17." and insert --19.--, delete "claim 16" and insert --claim 18--.
In Col. 8, line 17, claim 18, delete "18." and insert --21.--, delete "claim 16" and insert --claim 18--.
In Col. 8, line 22, claim 19, delete "19." and insert --2.--.
In Col. 8, line 26, claim 20, delete "20." and insert --3.--.

Signed and Sealed this
Fifteenth Day of April, 2014

Michelle K. Lee
*Deputy Director of the United States Patent and Trademark Office*